United States Patent
Huang et al.

(10) Patent No.: US 6,651,865 B2
(45) Date of Patent: Nov. 25, 2003

(54) POSITION-, SPEED- AND FORCE-CONTROLLABLE CHIP ACCESSING APPARATUS

(75) Inventors: Story Huang, Hsinchu (TW); Szu-Hui Lee, Taichung (TW); Yvonne Chang, Hsinchu (TW); Hung-I Lin, Pingtung (TW); Jia-Bin Hsu, Yunlin (TW); Chun-Hsien Liu, Taipei (TW)

(73) Assignee: Industrial Technology Research Institute, Hsinchu Hsien (TW)

( * ) Notice: Subject to any disclaimer, the term of this patent is extended or adjusted under 35 U.S.C. 154(b) by 0 days.

(21) Appl. No.: 10/187,955

(22) Filed: Jul. 3, 2002

(65) Prior Publication Data

US 2003/0197048 A1 Oct. 23, 2003

(30) Foreign Application Priority Data

Apr. 22, 2002 (TW) ........................................ 91205387 U (51) Int. Cl.[7] .......................... B23Q 15/22; B23K 37/04
(52) U.S. Cl. ........................ 228/9; 228/12; 228/49.1; 228/49.5
(58) Field of Search ................................. 228/102, 103, 228/8–12, 47.1, 49.1, 49.5; 156/362, 363, 350, 351, 538, 539

(56) References Cited

U.S. PATENT DOCUMENTS

| | | | |
|---|---|---|---|
| 5,059,559 A | * 10/1991 | Takahashi et al. | .......... 228/105 |
| 5,201,453 A | 4/1993 | Amador et al. | |
| 5,351,872 A | * 10/1994 | Kobayashi | .................. 228/6.2 |
| 5,447,266 A | * 9/1995 | Misono | ..................... 228/102 |
| 5,579,985 A | * 12/1996 | Ichikawa | .................... 228/102 |
| 5,667,129 A | * 9/1997 | Morita et al. | ............... 228/102 |
| 6,302,313 B1 | * 10/2001 | Tanaka | ........................ 228/102 |
| 6,439,447 B1 | * 8/2002 | Minamitani et al. | ........ 228/104 |
| 6,581,817 B2 | * 6/2003 | Kawashima et al. | ......... 228/6.2 |
| 2003/0015569 A1 | * 1/2003 | Wong et al. | ................. 228/102 |

* cited by examiner

Primary Examiner—M. Alexandra Elve
Assistant Examiner—Kevin McHenry
(74) Attorney, Agent, or Firm—Rabin & Berdo, P.C.

(57) ABSTRACT

A position-, speed- and force-controllable chip accessing apparatus comprises a fixing seat, a rotational direction moving device, a linear direction moving device, and a position sensing device, characterized in that a flexible positioning means is provided at a proper central site of said fixing seat and is screw fixed with said rotational direction moving device; one side of said rotational direction moving device is coupled with said linear direction moving device, while the other side of said rotational direction moving device is coupled with said position sensing device screw; and that by measuring with a speed sensor and a position sensing device on said linear direction moving device, the control of the force, speed and moving distance can be achieved.

20 Claims, 9 Drawing Sheets

POSITION-, SPEED- AND FORCE-CONTROLLABLE CHIP ACCESSING APPARATUS

BACKGROUND OF THE INVENTION

1. Field of the Invention

The invention relates to a position-, speed- and force-controllable chip accessing apparatus, and particularly, to a position-, speed- and force-controllable chip accessing apparatus having its force controlled and its speed measured by VCM and its displacement controlled by an optical rule.

2. Description of the Prior Art

Figure 9:
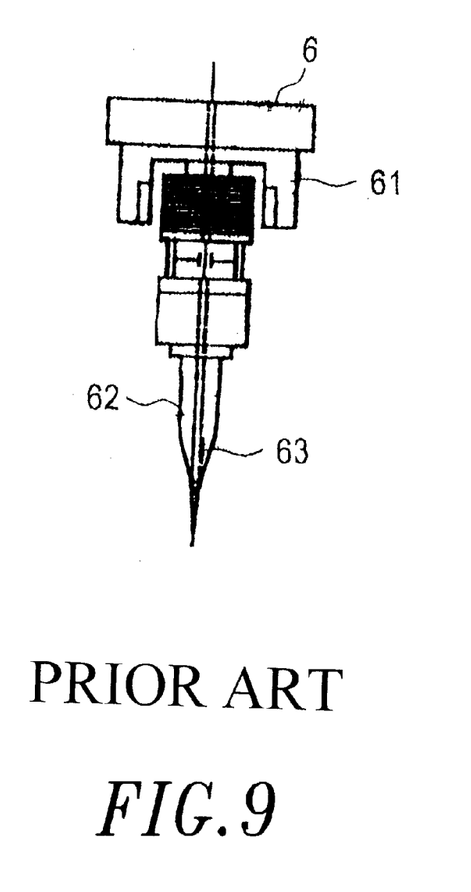
FIG. 9 is the schematic front view of the chip accessing apparatus disclosed in U.S. Pat. No. 5,201,453.

Referring to FIG. 9, a chip accessing apparatus 6 as disclosed in U.S. Pat. No. 5,201,453 comprises a driving assembly 61 and a chip sucker 62. In actual operation, said driving assembly 61 drives said chip sucker 62 into a vertical movement by means of a high frequency ultrasonic transducer, and sucks a chip onto a Suction hole 63 by means of said chip sucker 62. Then, the chip accessing apparatus 6 is brought to a position above a work piece (an article to be processed), where said high frequency ultrasonic transducer drives said chip sucker 62 to mount the chip on said work piece for the purpose of processing. However, there is a disadvantage in this prior art in that the control of the working force can not be accomplished very precisely such that during the suction of the chip, the chip tends to be broken due to the too strong press down force from the chip sucker. Further, the speed of the pressing down chip accessing apparatus 6 can result in the varying of force and hence render the control of the force more difficult. Unfortunately, since no speed control design is provided with this conventional chip accessing apparatus 6, off grade products produced during processing with this device often increase the cost of production. Moreover, when the driving assembly 61 of this conventional chip accessing apparatus 6 drives the chip sucker 62 into a vertical movement, absence of positioning of displacement may lead the chip accessing apparatus 6 move a too deeper distance and hence break the chip, or may result in a insufficient displacement and hence the chip cannot be picked by suction. Furthermore, since the mounting on a work piece should be in a precise position and an accurate angle, while the conventional chip accessing apparatus 6 is not able to control the position and the angle in the moment of mounting a chip on a work piece, bad products are increased consequently.

In view of these, the conventional chip accessing apparatus has still a number of disadvantages, and is not one of perfect design.

The inventor has studied intensively for solving advantages associated with the conventional chip accessing apparatus and finally, developed successfully a position-, speed- and force-controllable chip accessing apparatus.

SUMMARY OF THE INVENTION

Accordingly, one object of the invention is to provide a position-, speed- and force-controllable chip accessing apparatus, that can avoid breakage of chip due to too strong force or too high speed, and that can apply a specific compress force for controlling position, speed and force.

Another object of the invention is to provide a position-, speed- and force-controllable chip accessing apparatus that can control its displacement by means of an optical rule to facilitate the accessing and programmable moving of the chip.

Yet another object of the invention is to provide a position-, speed- and force-controllable chip accessing apparatus, that can rotate the chip sucker by means of a servo motor to bring the chip to a desired angle and direction.

Yet still another object of the invention is to provide a position-, speed- and force- controllable chip accessing apparatus characterized in that by virtue of position-, speed- and force-control, the breakage of the chip can be avoided and that it can provide an appropriate compressing force to achieve the purpose of cost-saving.

The position-, speed- and force-controllable chip accessing apparatus that can fulfill objects mentioned above comprises:

a fixing seat, provided with a flexible positioning means at a proper central site on the right side of said fixing seat;

a rotational direction moving device, comprising of a servo motor and a chip sucker, wherein a Suction hole is provided on one side of said chip sucker, while a suction chamber is provided at a corresponding position on the rotation shaft; wherein a rubber gasket is provided around each of the upper and lower end of the suction chamber for preventing air from escaping out of the suction chamber; and an air guiding port for communicating with said suction hole on said chip sucker is provided in said suction chamber, a linear direction moving device, comprising a driving means, and a speed sensor, wherein said driving means and said speed sensor are composed of an ultrasonic transducer; wherein said speed sensor is provided on the outer periphery of said driving means; and wherein said linear direction moving device is fixed on said rotational direction moving device through a Connecting element; and a position sensing device, comprising an optical rule attached on a side of said rotational direction moving device, and a detector fixed on said fixing seat with a screw at a position corresponding with said optical rule.

BRIEF DESCRIPTION OF THE DRAWING

The drawings disclose an illustrative embodiment of the present invention, which serves to exemplify the various advantages and objects hereof, and are as follow.

SYMBOLS OF MAIN ELEMENTS

1 Fixing seat
11 Flexible positioning means
111 Base
112 Round screw
113 Spring
114 Connecting element
115 Joining plate
116 Sliding block
117 Guiding track
2 Rotational direction moving device
21 Servo motor
211 Shaft coupling element
22 Chip sucker
221 Bearing
222 Rotational shaft
223 Suction hole
224 Suction chamber
225 Sucking port
226 Air guiding hole
2261 Vent
227 Rubber gasket
228 Locking element
229 Suction channel
3 Linear direction moving device
31 Driving means
311 ⊥-shaped yoke
3111 Extending long edge
312 Coil
313 ]-shaped yoke
314 Magnet
32 Speed sensor
321 Protruding block
322 Coil
323 Speed sensing-yoke
3231 Leg
3232 Baffle
324 Speed sensing magnet
33 Connecting element
4 Position sensing device
41 Optical rule
42 Sensor
43 Base
Screw
6 Conventional chip accessing apparatus
61 Driving assembly
62 Chip sucker
63 Sucking port

DETAILED DESCRIPTION OF THE PREFERRED EMBODIMENT

Figure 1:
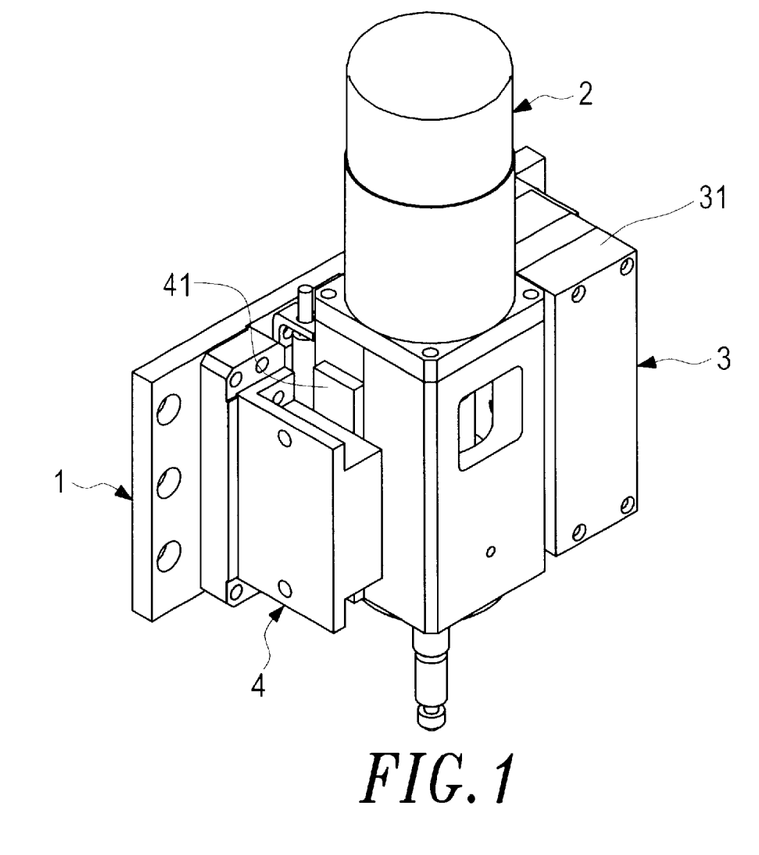
FIG. 1 is a three-dimensional out looking view of the position-, speed- and force-controllable chip accessing apparatus according to the invention.
Figure 2:
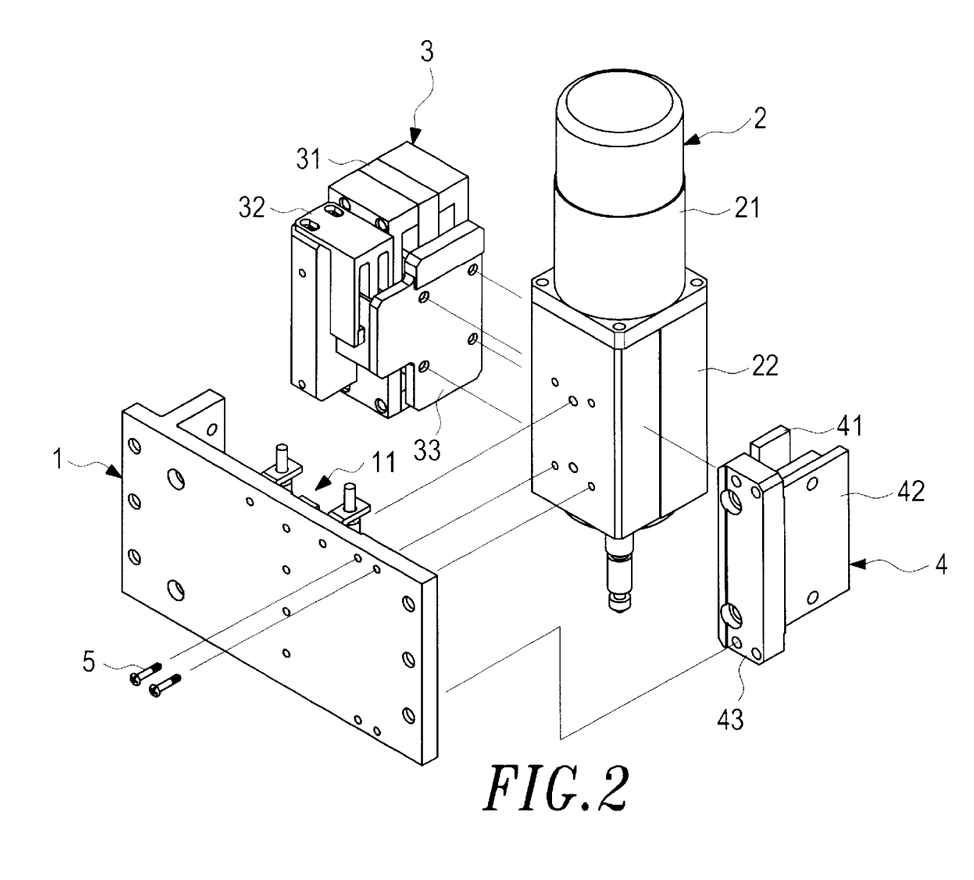
FIG. 2 is a three-dimensional exploded view of the position-, speed- and force-controllable chip accessing apparatus according to the invention.
Figure 8:
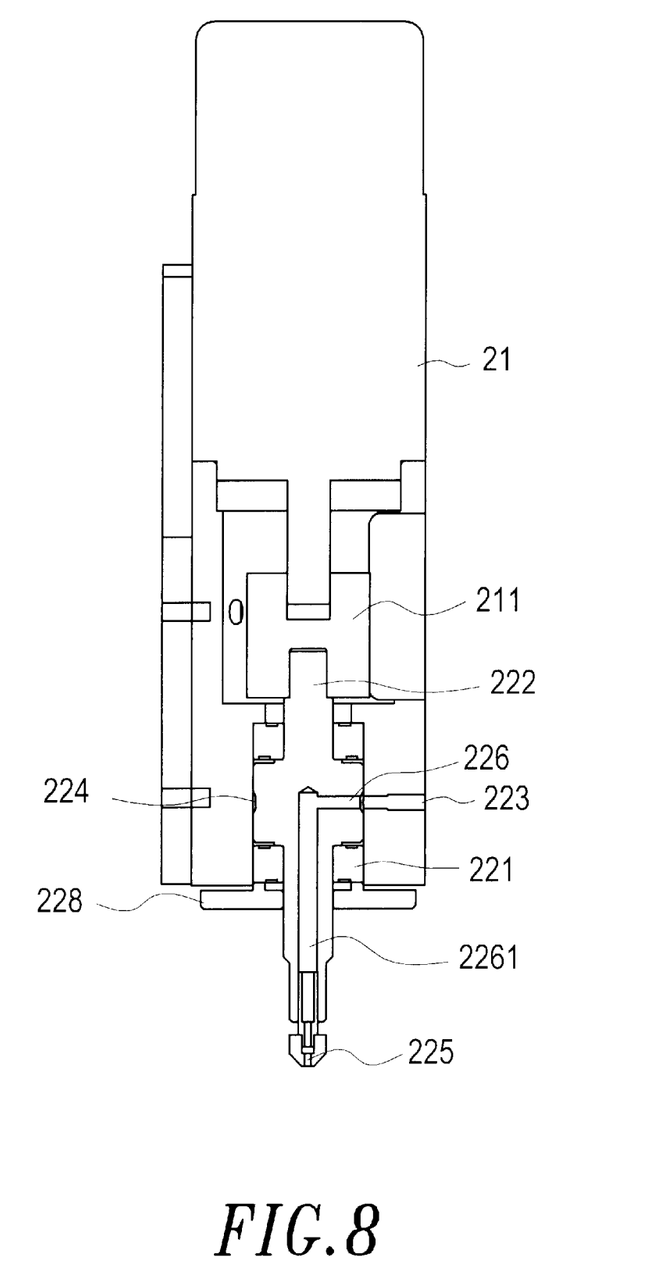
FIG. 8 a lateral exploded view of another embodiment of the rotational device according to the invention.

Referring to FIG. 1 and 2, showing the three-dimensional out looking and exploded view, respectively, of the position-, speed- and force-controllable chip accessing apparatus according to the invention, which comprises essentially:

a fixing seat 1 (FIG. 3), provided with a flexible positioning means 11 at a proper central site on the right side of said fixing seat; wherein said flexible positioning means 11 comprises a base 11 having a spring 113 on each side thereof; a round screw 112 is provided above each of said spring 113; each of these two round screw is hold through a ]-shaped connecting element 114 provided above each of these two round screw 112; each of these two connecting element 114 is fixed on said fixing seat 1 with a screw 5; a joining plate 115 is provided protrusive wise on a central area of said base 111 and fixed with said base each other; a sliding block 116 is fixed with a screw on the rear side of said joining plate; and said sliding block 116 is fit in a guiding track 117 joined with said base 1;

a rotational direction moving device 2 (FIG. 4), being screw fixing with said joining plate 115 of said flexible positioning means 11 on said fixing seat 1 and comprising of a servo motor 21 and a chip sucker 22, wherein the lower portion of said servo motor 21 is connected with a rotational shaft 222 through a shaft coupling element 211, and is fit intimately with the rotational shaft 222 of a chip sucker 22 by means of the inner liner of the back-to-back bearing 221, such that a pre-pressing adjustment can be made by means of a locking element 228 to achieve the object of zero gap in the radial direction; said locking element 228 is fixed with the lower portion of the chip sucker 22 each other in a manner that said rotational shaft 222 and said shaft coupling element 221 can be supported within said locking element 228 and rotates readily; a suction hole 223 is provided at one side of said chip sucker 22; a sucking port 225 is provided on the lower axial center of said rotational shaft 222; a suction chamber 224 is provided on said rotational shaft 222 at a position corresponding to said suction hole 223; an air guiding hole 226 is provided within said suction chamber 224 and a vent 2261 is provided at the lower center of said rotational shaft 222 to communicate with said sucking port 225 and said air guiding hole 226; further, a rubber gasket 227 is provided around each of the upper and lower end of the suction chamber 224 on said rotational shaft 222 for preventing air from escaping out of the suction chamber 224; alternatively, said suction chamber 224 can be sealed through precise mechanical processing (FIG. 8) without providing said rubber gasket 227 around said rotational shaft 222;

a linear direction moving device (FIG. 5), comprising a driving means 31, and a speed sensor 32, wherein said driving means 31 and said speed sensor 32 are of VCM design; said driving means comprises a ⊥-shaped (T-shaped) yoke 311; wherein a coil 312 is provided around the extending long edge 3111 of said ⊥-shaped yoke 311 in a manner that said ⊥-shaped yoke 311 can slide within said coil 312; said coil 312 is fixed on said connecting element 33 with an adhesive; more than one of threaded holes are provided on the upper and lower end of the right and left side of said ⊥-shaped yoke 311; a corresponding ]-shaped (L-shaped) yoke 313 is provided on the right and left side of said ⊥-shaped yoke 311; more than one of screw holes are provided on the upper and lower end of said two ⊥-shaped yoke 313 at a position corresponding to said screw holes on said ]-shaped yoke 311 in a manner such that the screw 5 can be fixed with said threaded holes on said ⊥-shaped yoke 311; a magnet 314 is provided on the side of said ]-shaped yoke 313 adjacent to said ⊥-shaped yoke 311 at a position corresponding to said inductance coil 312 in a manner such that an electric field produced as a current is applied on said coil 312 can interact with said magnet 314 so as to drive said chip sucker into linear motion; said speed sensor 32 is provided on the outer periphery of said ]-shaped yoke 313 on one side of said driving means 31; further, a protruding block 321 is provided on the outer periphery of said ]-shaped yoke 313 of said speed sensor 32, and several screw holes are provided on the top and lateral side, respectively, of said protruding block 321; the central leg of the three legs 3231 extending downwardly from said speed-sensing yoke 323 passes downwardly through said coil 322, wherein a speed sensing-magnet 324 is provided at the inner sides on the lower end of two lateral legs 3231; further, at the rear side on the upper portion of said speed sensing-yoke 324, a baffle block 3232 is provided and extended toward said protruding block 321; screw holes are provided on said baffle block 3232 at positions corresponding to holes provided on the upper portion of said protruding block 321 in manner that said baffle block can be fixed with said protruding block 321 with screw 5; further, in front of said linear direction moving device 3, a connecting element 33 is provided and is adhered with said coil 312 of said driving means 32 as well as with said coil 322 of said speed sensor 32 by means of an adhesive in a manner that, after applying electric current, said coil 322 of said speed sensor 32 can move linearly together with said coil 312 of said driving means 32 so as to detect the amount of the electric current and the speed; and wherein several threaded holes are provided on said connecting element 33 for being fixed on said rotational direction moving device 2 with screws 5;

a position sensing device 4, comprising an optical rule 41 and a detector; wherein said optical rule 41 is adhered on a side of said rotational direction moving device 2; said detector 42 is provided on a base 43 at a position corresponding with said optical rule and is fixed on said fixing seat 1 with said screw 5.

Figure 3:
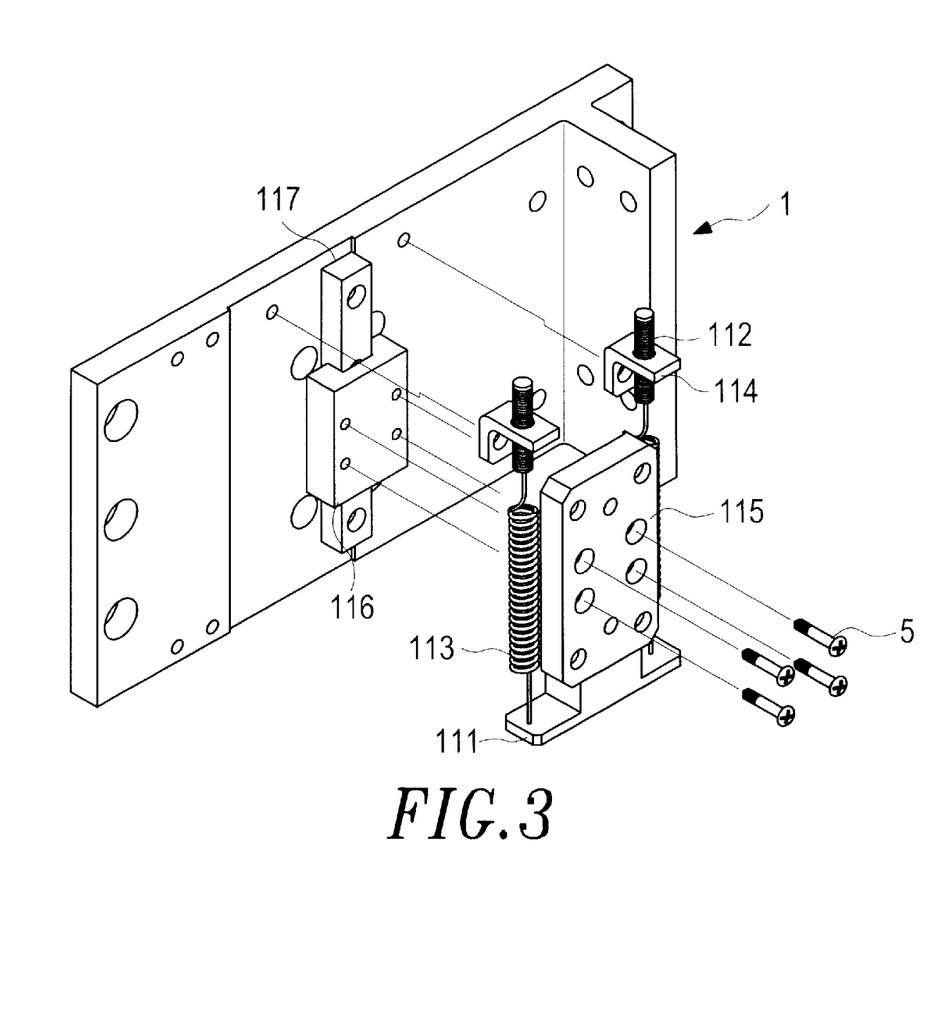
FIG. 3 is a three-dimensional out looking view at another viewing angle of the fixing seat in the position-, speed- and force-controllable chip accessing apparatus according to the invention.
Figure 4:
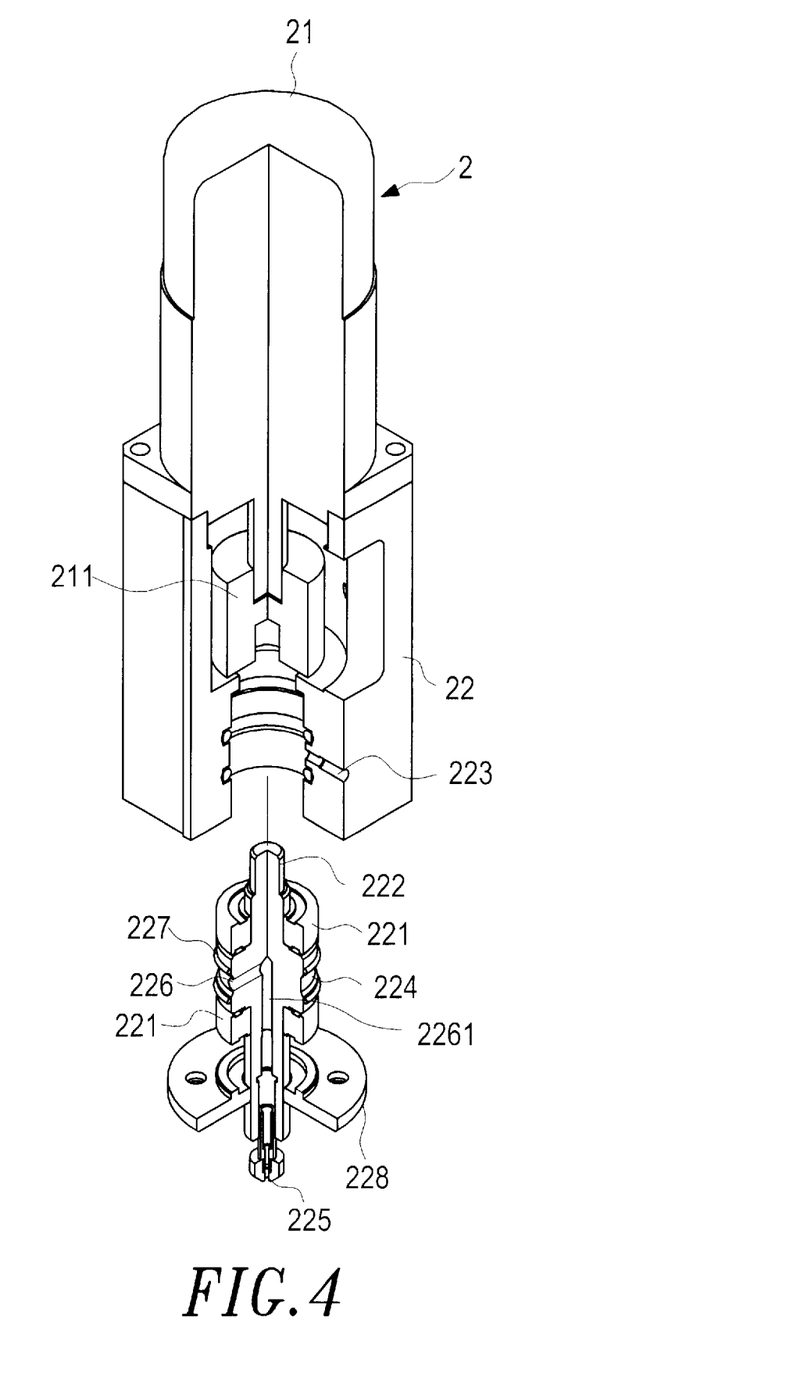
FIG. 4 is a three-dimensional exploded view of the rotational direction-moving device in the position-, speed- and force-controllable chip accessing apparatus according to the invention.
Figure 5:
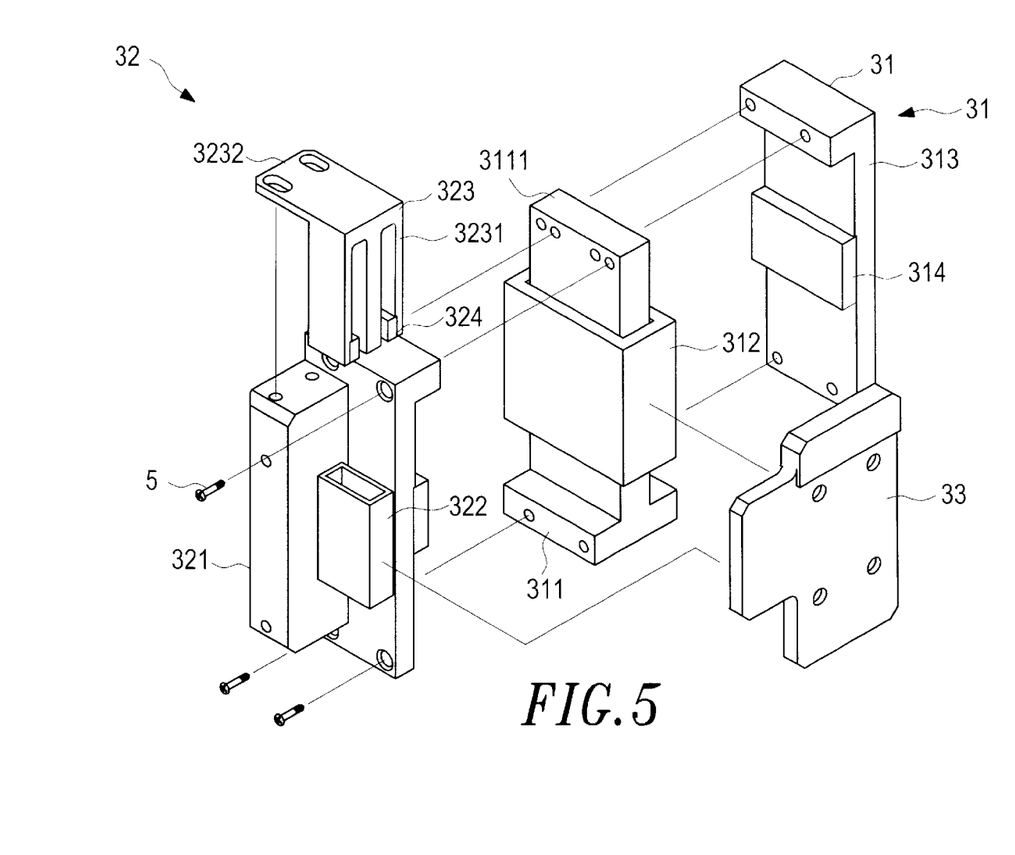
FIG. 5 is a three-dimensional exploded view of the linear direction-moving device in the position-, speed- and force-controllable chip accessing apparatus according to the invention.
Figure 6:
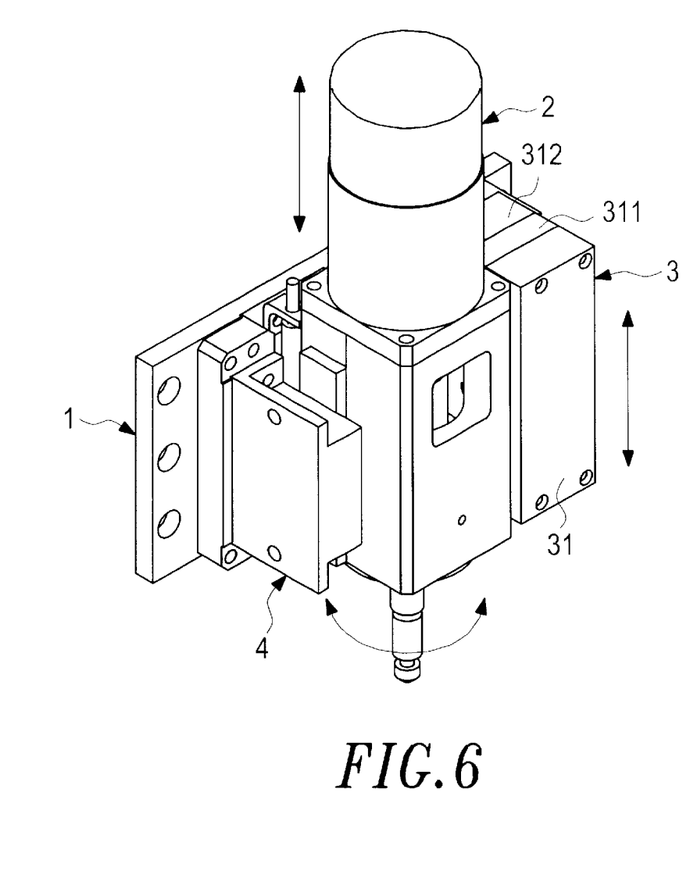
FIG. 6 is a schematic view illustrating the operation of the position-, speed- and force-controllable chip accessing apparatus according to the invention.

Referring to FIG. 6 together with FIG. 3, 4 and 5), the position-, speed- and force- controllable chip accessing apparatus according to the invention is driven by the driving means 31 of the linear direction moving device 3. the driving means comprises an ultrasonic motor as the source of the driving force. Since a magnetic field is formed by the magnet 314 and the coil 312, after applying an electric current, the change of the electric current on the coil 312 results in the interaction between the coil 312 and the stationary magnetic field, yielding a pushing force acting on the coil 312, and thereby, the linear direction moving device 3 brings the rotational direction moving device 2 moving downwardly along the sliding track 117 on the flexible positioning means 11, approaching and contacting with the chip under a controlled slow speed and with a specific force. Meanwhile, the rotational direction moving device 2 communicates with the sucking hole 223 and undergoes a suction operation such that air is sucked from the sucking port 225 on the chip sucker 22, passes through the air guiding hole 226 and enters into the suction chamber 224 via the sucking hole 223, whereby the suction force produced at the sucking port 225 can suck up the chip on the sucking port 225. Thereafter, the whole mechanic assembly brings the position-, speed- and force-controllable chip accessing apparatus to a position above a work piece where, the servo motor 21 (a step motor can be used as well) in conjunction with a coder brings the rotational shaft 221 of the chip sucker 22 into a rotational motion such that the chip sucked on the sucking port 225 rotates to a desired angle and direction and stops there. Then, upon applying an electric current, the driving means 31 rotates the rotational direction-moving device 3 to press downwardly such that the chip can be mounted on the work piece under a specific force. At the same time, the sucking hole 223 on the rotational direction moving device 3 stops sucking but releases air to break the vacuum and disengages the chip from the chip sucker 22 to facilitate the mounting of the chip on the work piece. Thereafter, the whole mechanic assembly brings the position-, speed- and force-controllable chip accessing apparatus returning to the original position and repeats the procedure described above.

In addition, when the driving means 31 of linear direction moving device 3 brings the rotational direction moving device 2 to press down, the speed sensor 32 on the linear direction moving device 3 can produce an electric current induced from the speed, which, owing to the moving speed in the stationary magnetic field, produces an electric current and an electric field on the coil 322, and thereby, measures the moving speed of the linear direction moving device 3. A signal thus produced is then transmitted to a control unit such that the control unit can control accordingly the pressing down speed of the linear direction-moving device 3. Furthermore, as the driving means 31 of the linear direction moving device 3 brings the rotational direction moving device 2 pressing downwardly, the positioning sensing device 4 can detect the moving scale of the optical rule 41 fixed adhesively on the lateral side of the rotational direction moving device 2 and thereby measures the distance that the rotational direction moving device 2 moves, and then transmits a signal to the control unit which can control accordingly the moving distance thereof to avoid the breakage of the chip caused by a too great pressing force or too long moving distance.

Figure 7:
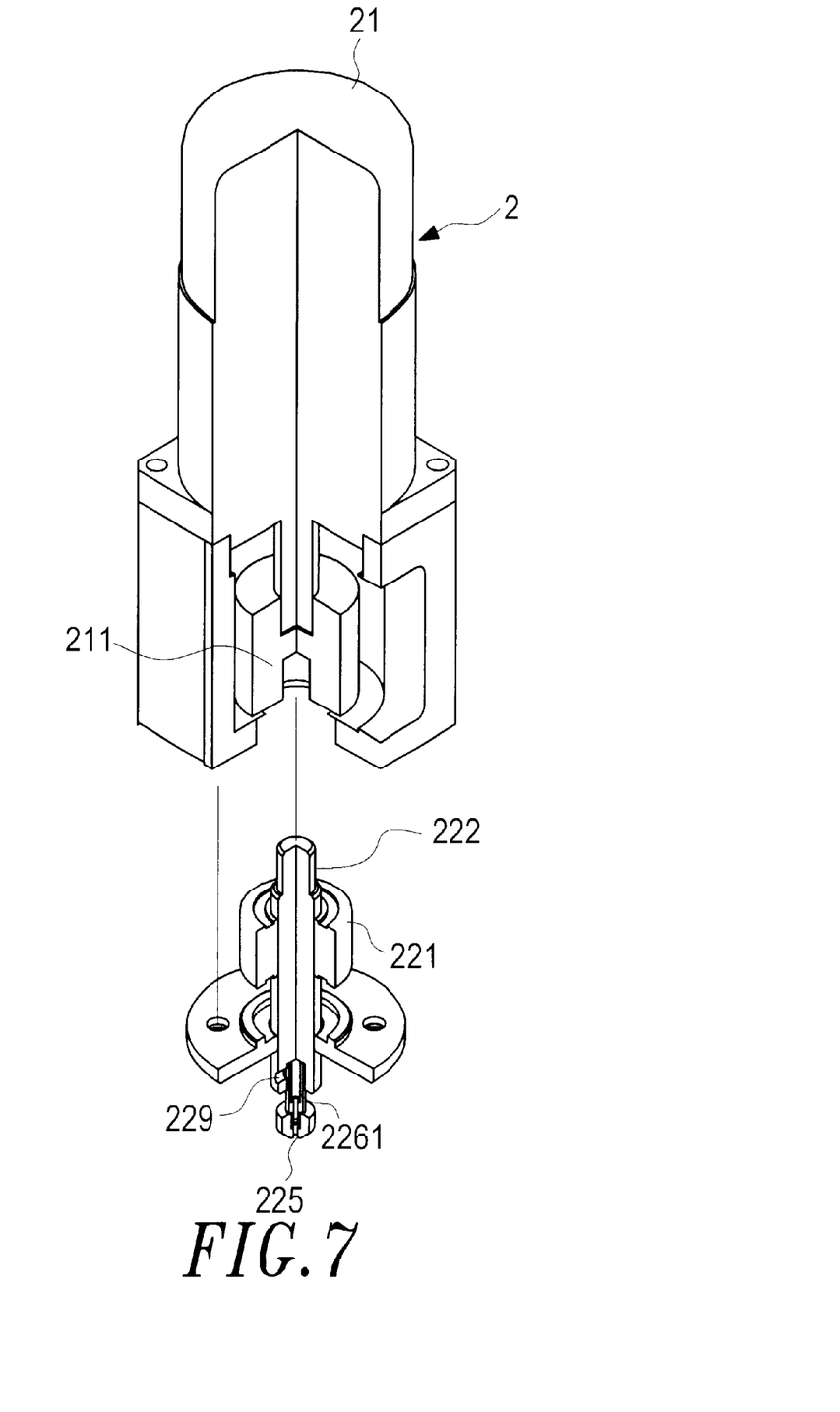
FIG. 7 is a three-dimensional exploded view of another embodiment of the rotational device according to the invention.

In another embodiment of the invention, when a small rotational angle of the rotational direction moving device 2 is required, the sucking hole 223 on the chip sucker 22 can be provided near the sucking port 225 and communicates with a suction channel 229 (FIG. 7).

The position-, speed- and force-controllable chip accessing apparatus according to the invention has several advantages over the conventional prior art in that:

1. The position-, speed- and force-controllable chip accessing apparatus according to the invention can reduce the risk of breakage of the chip by measuring with a speed sensor and a position sensing device and controlling accordingly the force, speed and moving distance, and thereby lowers the cost of processing.

2. The position-, speed- and force-controllable chip accessing apparatus according to the invention can bring the chip rotating to a desired position and angle, and thereby decreases the amount of off grade product.

Many changes and modifications in the above-described embodiment of the invention can, of course, be carried out without departing from the scope thereof. Accordingly, to promote the progress in science and the useful arts, the invention is disclosed and is intended to be limited only by the scope of the appended claims.

What is claimed is:

1. A position-, speed- and force-controllable chip accessing apparatus, comprises a fixing seat, a rotational direction moving device, a linear direction moving device, and a position sensing device, characterized in that:

a flexible positioning means at a central site on a right side of said fixing seat; said rotational direction moving device is provided on said flexible positioning means and one side of said rotational direction moving device is coupled with said linear direction moving device, while an other side of said rotational direction moving device is coupled with said position sensing device being fixed on said fixing seat; wherein, by measuring with a speed sensor and said position sensing device, a force, speed and moving distance of a chip sucker can be controlled accordingly, and wherein said rotational direction moving device can bring a chip rotating to a desired angle and position.

2. A position-, speed- and force-controllable chip accessing apparatus as recited in claim 1, wherein said flexible positioning means comprises a base having a round screw provided and extended upwardly on both sides thereof, and a joining plate provided protrusive wise on a central area of said base and fixed with said base; wherein a sliding block is fixed with a screw on the rear side of said joining plate; and said sliding block is fit in a guiding track joined with said base.

3. A position-, speed- and force-controllable chip accessing apparatus as recited in claim 2, wherein each of said round screws on said flexible positioning means comprises further a spring and is held through a connecting element screw fixed on said fixing seat.

4. A position-, speed- and force-controllable chip accessing apparatus as recited in claim 1, wherein said rotational direction moving device comprises a servo motor and a chip sucker.

5. A position-, speed- and force-controllable chip accessing apparatus as recited in claim 1, wherein said rotational direction moving device comprises a step motor and a chip sucker.

6. A position-, speed- and force-controllable chip accessing apparatus as recited in claim 4, wherein a lower portion of said servo motor is connected with a rotational shaft through a shaft coupling element, and is coupled with a rotational shaft of said chip sucker by means of a back-to-back bearing.

7. A position-, speed- and force-controllable chip accessing apparatus as recited in claim 6, wherein a lower portion of said chip sucker is fixed with a locking element in a manner that said bearing can be supported within said locking element and rotates readily.

8. A position-, speed- and force-controllable chip accessing apparatus as recited in claim 4, wherein a suction hole is provided on one side of said chip sucker, while a suction chamber is provided at a corresponding position on a rotation shaft of the rotational direction moving device; and a vent for communicating with a air guiding hole is provided on an axial center of the rotational shaft.

9. A position-, speed- and force-controllable chip accessing apparatus as recited in claim 8, wherein a sucking port is provided below said vent of said rotational shaft.

10. A position-, speed- and force-controllable chip accessing apparatus as recited in claim 7, wherein an air guiding hole communicating with a sucking port is provided within a suction chamber, and wherein a rubber gasket is provided around each of an upper and lower end of said suction chamber.

11. A position-, speed- and force-controllable chip accessing apparatus as recited in claim 7, wherein an upper and lower end of said suction chamber can be sealed through precise mechanical processing without providing a rubber gasket.

12. A position-, speed- and force-controllable chip accessing apparatus as recited in claim 8, wherein the air guiding hole on the rotational direction moving device can be provided at a position near said sucking port.

13. A position-, speed- and force-controllable chip accessing apparatus as recited in claim 8, wherein said linear direction moving device comprises a driving means and a speed sensor, wherein said driving means and said speed sensor are of VCM design.

14. A position-, speed- and force-controllable chip accessing apparatus as recited in claim 13, wherein said driving means comprises comprises a T-shaped yoke, a coil and a set of L-shaped yokes, and wherein said coil is provided through an extending edge of said T-shaped yoke and is fixed on a connecting element with an adhesive.

15. A position-, speed- and force-controllable chip accessing apparatus as recited in claim 14, wherein a magnet is provided at a position on said T-shaped yoke.

16. A position-, speed- and force-controllable chip accessing apparatus as recited in claim 13, wherein said speed sensor comprises a yoke, a coil and a protruding block.

17. A position-, speed- and force-controllable chip accessing apparatus as recited in claim 16, wherein said yoke is provided with three legs extended downwardly in a manner that the central leg is provided through said coil.

18. A position-, speed- and force-controllable chip accessing apparatus as recited in claim 16, wherein said coil is fixed with a connecting element using an adhesive.

19. A position-, speed- and force-controllable chip accessing apparatus as recited in claim 1, wherein said linear direction moving device is screw fixed with said rotational direction moving device through a connecting element.

20. A position-, speed- and force-controllable chip accessing apparatus as recited in claim 1, wherein said position sensing device comprises an optical rule and a detector, and wherein said optical rule is attached adhesively on a side of said rotational direction moving device, and said detector is fixed on said fixing seat with a screw at a position corresponding with said optical rule.

* * * * *